United States Patent [19]

Furlong et al.

[11] Patent Number: 4,639,824
[45] Date of Patent: Jan. 27, 1987

[54] TOUCH SENSOR FOR WIRE STRIPPER

[75] Inventors: James J. Furlong, Seattle; Dwayne E. Howe, Kent, both of Wash.

[73] Assignee: The Boeing Company, Seattle, Wash.

[21] Appl. No.: 655,495

[22] Filed: Sep. 28, 1984

Related U.S. Application Data

[63] Continuation-in-part of Ser. No. 353,750, Mar. 1, 1982, abandoned.

[51] Int. Cl.⁴ ............................................ H01H 47/12
[52] U.S. Cl. ...................................... 361/179; 361/181
[58] Field of Search .................... 361/181, 179, 180; 307/116, 125

[56] References Cited

U.S. PATENT DOCUMENTS

| | | | |
|---|---|---|---|
| 2,292,846 | 8/1942 | Pritchard | 361/181 X |
| 3,575,640 | 4/1971 | Ishikawa | 361/181 |
| 3,725,808 | 4/1973 | Oushige et al. | 361/181 X |
| 4,246,533 | 1/1981 | Chiang | 307/116 X |

Primary Examiner—Michael L. Gellner
Assistant Examiner—D. Ruthledge
Attorney, Agent, or Firm—Conrad O. Gardner; B. A. Donahue

[57] ABSTRACT

A wire detector for semi-automatic wire stripper which responds to capacitance changes caused by sensing a capacitive object such as an exposed wire end and includes signal processing through an oscillator and amplifier circuit providing timer control for activating a relay driver circuit for an adjustable duration time period. The wire touch sensor circuit relay driver is then coupled through a mercury wetted relay which provides electrical isolation from external (switched) voltages to an air solenoid which, when actuated, allows the pneumatic mechanism of the wire stripper to cycle through its function of wire stripping.

3 Claims, 2 Drawing Figures

TOUCH SENSOR FOR WIRE STRIPPER

This application is a continuation-in-part of Patent Application Ser. No. 353,750 filed Mar. 1, 1982, now abandoned assigned to The Boeing Company.

BACKGROUND OF THE INVENTION

The present invention relates to touch sensors for wire strippers and more particularly to a picofarad detector circuit which provides wire sensing through capacitance change in order to provide air solenoid control for allowing pneumatic mechanisms to cycle through their functions of wire stripping.

The prior art patent literature has included non-capacitance type wire contact switch means for actuating terminal crimping devices as shown in U.S. Pat. Nos. 2,775,283; 2,889,422; and, 3,004,581. The patent literature also includes capacitance type contact switching circuits as shown in U.S. Pat. Nos. 3,571,666; 3,725,808; 3,927,336; and, 4,169,982. A capacitance type contact sensing circuit utilized for sensing interruptions in a moving fiber strand has been disclosed heretofore as shown in U.S. Pat. No. 3,438,189.

SUMMARY OF THE INVENTION

In contrast, it is an object of the present invention to utilize capacitance touch wire sensing for starting a timer circuit to activate the wire stripper by engaging a solenoid valve.

In accordance with a preferred embodiment of the present invention, a touch sensor for wire stripper devices comprises a picofarad detector circuit responsive to initial contact wire change capacitance and incorporates an oscillator circuit, an inverse amplifier circuit, and timer circuit for activating a relay driver circuit.

A full understanding of the invention, and of its further objects and advantages and the several unique aspects thereof, will be had from the following description when taken in conjunction with the accompanying drawings in which:

DESCRIPTION OF THE PREFERRED EMBODIMENT

Figure 1:
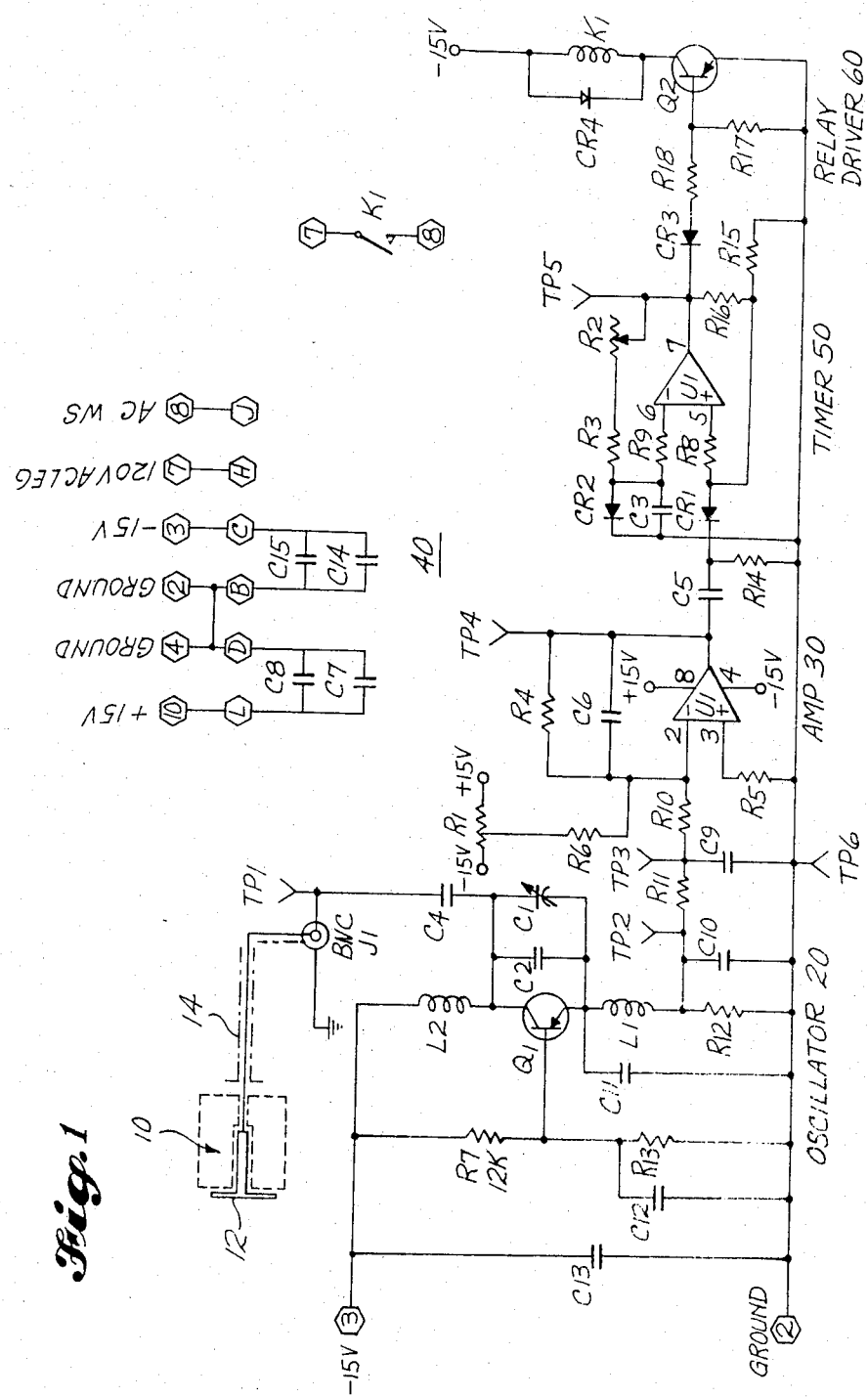
FIG. 1 is a schematic diagram of an adjustable picofarad detector circuit in accordance with a preferred embodiment of the invention; and, FIG. 2 is a system diagram showing a plurality of the touch sensor circuits of FIG. 1 utilized to actuate a plurality of wire stripper solenoids.
Figure 2:
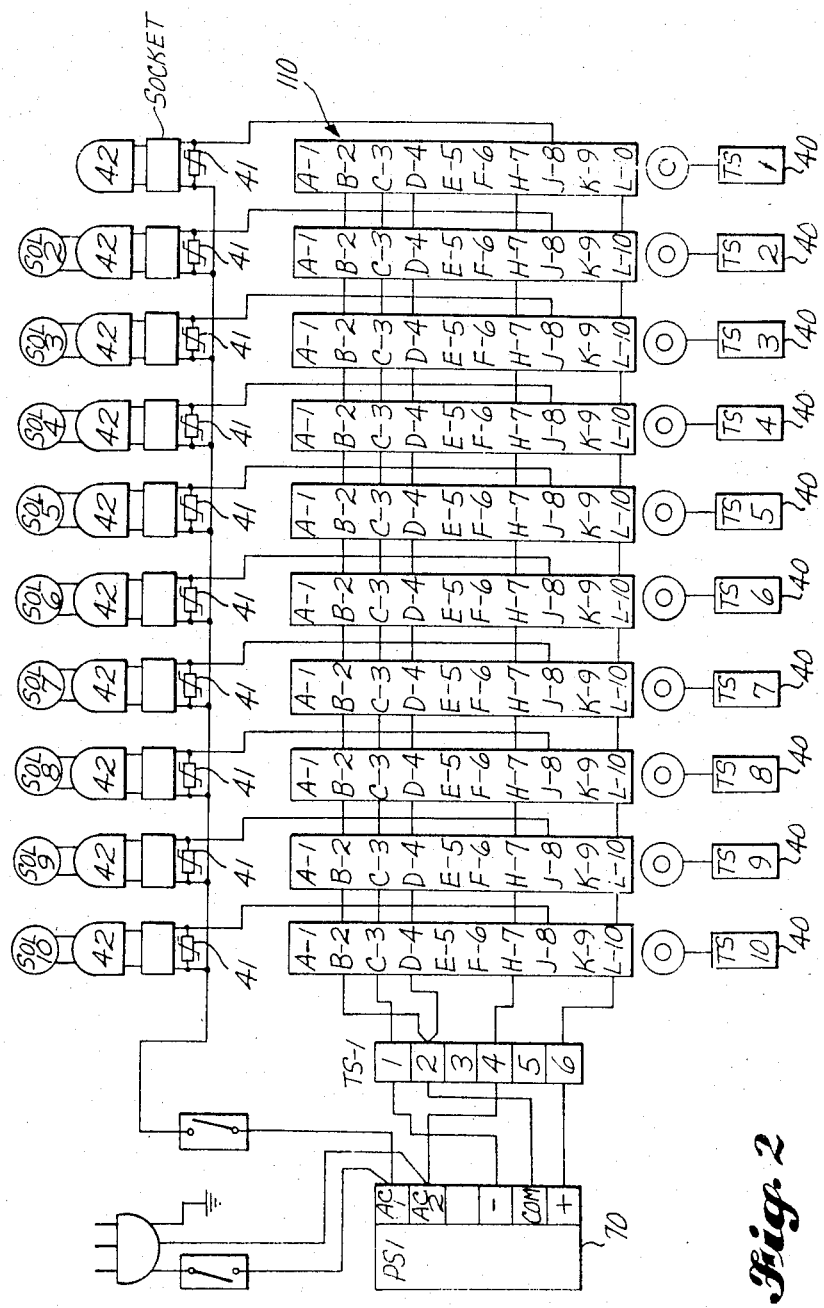

The present touch sensor circuit shown in FIG. 1 may be utilized ten times as shown in FIG. 2 at TS1 through 10 to control a corresponding number of solenoids for stripping a corresponding plurality of wires in known type wire stripping equipment. A capacitance sensor button 10 has an end plate 12 for contacting a (capacitive) wire (not shown) which changes capacitance of sensor lead 14. Contact plate 12 is coupled through a coaxial cable having a capacitance of forty to eighty picofarads through, as in input, to oscillator circuit 20 by means of input terminal J1. A capacitance change resulting from contact of the wire (not shown) changes the oscillation in oscillator detector circuit 20 which is integrated downstream by inverse amplifier circuit 30, thereby providing a discrete level output voltage. The discrete level output voltage from inverse amplifier circuit 30 triggers timer circuit 50 which activates relay driver circuit 60 for an adjustable period of duration.

Turning now to FIG. 2, it can be seen that, in a wire stripping environment, a plurality of touch sensor circuits 40 deriving their power sources from power supply 70 are coupled through a corresponding number of mercury wetted relays 41 and socket connectors 42 to wire stripper or device actuating solenoids 1 through 10. A plurality of card edge type connectors 110 are utilized to connect the plurality of touch sensor circuits 40 to power supply source 70 with legends on connectors 110 corresponding to hexagonally tacked numerals on the sensor circuits shown at 40 in FIG. 1.

Electronic touch sensor circuit 40 shown in FIG. 1 which is utilized in a system such as shown in FIG. 2 for activating solenoids in a semi-automatic wire stripper is, as hereinbefore mentioned, an adjustable type picofarad detector circuit. Sensitivity and triggering the threshold of picofarad detector circuit 40 are interactively variable, thereby allowing precise tuning of the detector to specific ranges of sensitivity. Switch output duration is adjustable from twenty milliseconds to one second, and is isolated electrically from the circuit.

Circuit interaction in multiple circuit applications such as shown in FIG. 2 are controlled through isolation hereinbefore mentioned, thereby allowing maximum sensitivity adjustment to detect objects such as exposed ends of insulated wire coupled to plate 12 with as little as five picofarads of capacitance. Objects at (or near) ground potential may be detected at the other extreme of adjustment. Range settings may be established to the last specific detection margins within this broad range of contact detectability. Circuit components and values are detailed for oscillator circuit 20, amplifier circuit 30, timer circuit 50, and relay driver circuit 60 as shown in FIG. 1.

A number of test points marked TP1, TP2, etc. are shown in the schematic diagram of FIG. 1. Test point 1 relates to sensor cable 14 capacitance. This point permits the capacitance of the sensor cable to be checked. The capacitance should measure between forty and eighty picofarads.

Test point 2 relates to trigger verification. This point provides connection for verifying that the oscillator circuit 20 is properly functioning and is correctly triggering. An oscilloscope connected at this test point should display a saw-toothed waveform when the circuit is activated. The oscilloscope settings for horizontal sweep should be twenty microseconds per division and vertical magnitude set a five volts per division. Before triggering, a straight line appears on the scope and triggered, a saw-toothed waveform is displayed.

Test point 3, marked TP3, relates to sensitivity adjustment. An oscilloscope is connected to test point 3 and an 8-inch wire is inserted into the module to trigger it. Sensitivity should be adjusted for a maximum voltage shift on triggering. However, the module should not remain in the triggered mode after the solenoid valve shown in the system of FIG. 2 has opened. In this test, the oscilloscope settings should be horizontal sweeps twenty microseconds per division and vertical magnitude five volts per division.

Test point 4, marked TP4, touch sensor 40 of FIG. 1, requires the threshold voltage to be maintained at +10 volts D.C. The threshold adjustment screw is identified as R1 in FIG. 1. The voltage should drop to −15 volts upon triggering the module. Oscilloscope settings should be horizontal sweeps at twenty microseconds per division and vertical magnitude at five volts per division (D.C. coupled).

A further test point, helpful in understanding circuit 40 function, relates to test point TP5 regarding ON time. The amount of time the module remains activated before it returns to its ready to strip condition is determined by the adjustment of screw marked R2 (variable potentiometer) which can be monitored at test point 5. Normally, an ON time of thirty milliseconds is desired but, in certain cases, a longer time is needed for the module to fully activate. Therefore, in some cases, forty milliseconds or more may be required. An oscilloscope setting in this test point should be horizontal sweep at twenty milliseconds per division and vertical magnitude at five volts per division. The oscilloscope should be placed in the STORAGE mode. The module at 10 should be activated by touching a test wire to the sensor plate 12 as in a normal wire stripping operation. Note the time duration of the blip in the display on the oscilloscope which conveys the ON time.

A further test point, helpful in understanding the operation of touch sensor circuit 40, is test point 6 (TP6) which is the ground for the circuit to which the oscilloscope ground connection should be made in the aforementioned test.

The wire stripping unit utilizing solenoids 1 through 10 in the system of FIG. 2 may be an Ideal Industries Power Stripmaster Model 45-145.

In an actual wire stripping environment, inserting a wire until it touches plate 12 of touch sensor circuit 40 results in triggering of the gripper jaws to hold the wire while cutting blades strip off the insulation with air operation of jaws and blades.

In the exemplary adjustable picofarad detector circuit of FIG. 1 according to the invention, components and electrical values successfully utilized are as follows.

| R1 | 50KΩ trim pot | C1 | 120 pF trim cap |
|---|---|---|---|
| R2 | 1 MΩ trim pot | C2 | 22 pF |
| R3 | 10KΩ | C3 | 1.0 μF |
| R4 | 470KΩ | C4 | 470 pF |
| R5 | 10KΩ | C5 | 1.0 μF |

-continued

| R6 | 30KΩ | C6 | 0.1 μF |
|---|---|---|---|
| R7 | 12KΩ | C7 | 0.1 μF |
| R8 | 10KΩ | C8 | 33 μF |
| R9 | 10KΩ | C9 | 0.1 μF |
| R10 | 30KΩ | C10 | 0.1 μF |
| R11 | 10KΩ | C11 | 47 pF |
| R12 | 1.8KΩ | C12 | 0.1 μF |
| R13 | 5.6KΩ | C13 | 0.1 μF |
| R14 | 100KΩ | C14 | 0.1 μF |
| R15 | 15KΩ | C15 | 33 μF |
| R16 | 100KΩ | Q1 | 2N869A |
| R17 | 2.2KΩ | Q2 | 2N3906 |
| R18 | 1KΩ | U1 | MC1458P Dual Op. Amp. |
| CR1 | 1N459 | Probe - ~80 pF (40–80 pF) | |
| CR2 | 1N459 | (Isolated Cap. Sen.) | |
| CR3 | 1N459 | J1 - UG-1098/U BNC Bulkhead Receptacle | |
| CR4 | 1N459A | TP1-6 - Horizontal Jack | |
| L1 | 82 μH | | |
| L2 | 0.7 μH | | |
| K1 | Relay, mercury wetted, 851A12B1A, C.P. CLARE | | |

We claim:

1. An adjustable picofarad detector circuit comprising in combination:
    a capacitance sensing probe having an electrically conductive plate member;
    an oscillator circuit coupled to said capacitance sensing probe;
    a timer circuit;
    an inverse amplifier circuit coupled between said oscillator circuit and said timer circuit for providing a discrete level output signal when said electrically conductive plate member contacts a wire thereby triggering said timer circuit; and,
    a relay driver circuit responsive to said timer circuit for an adjustable time period.

2. The invention according to claim 1 wherein said capacitance sensing probe includes a coaxial cable having a capacitance between forty and eighty picofarads coupled between said electrically conductive plate member and said oscillator circuit.

3. The invention according to claim 1 including means for variably adjusting the switching output voltage time period of said adjustable picofarad detector circuit from twenty milliseconds to one second.

* * * * *